United States Patent [19]

Morgan et al.

[11] Patent Number: 4,552,740

[45] Date of Patent: Nov. 12, 1985

[54] PROCESS FOR PRODUCING AMORPHOUS AND CRYSTALLINE SILICON NITRIDE

[75] Inventors: Peter E. D. Morgan, Thousand Oaks; Eloise A. Pugar, Newbury Park, both of Calif.

[73] Assignee: Rockwell International Corporation, El Segundo, Calif.

[21] Appl. No.: 704,979

[22] Filed: Feb. 22, 1985

[51] Int. Cl.$^4$ ............................................ C01B 21/068
[52] U.S. Cl. .................................... 423/344; 423/345; 423/406
[58] Field of Search ................................ 423/344, 406

[56] References Cited

U.S. PATENT DOCUMENTS 3,211,527 10/1965 Forsyth ................................ 423/344

OTHER PUBLICATIONS

Behrens, et al., "Chem. Abstracts", 1962, p. 386f.

*Primary Examiner*—Jack Cooper
*Attorney, Agent, or Firm*—H. Fredrick Hamann; Craig O. Malin; Max Geldin

[57] ABSTRACT

A process for producing amorphous or crystalline silicon nitride is disclosed which comprises reacting silicon disulfide ammonia gas at elevated temperature. In a preferred embodiment silicon disulfide in the form of "whiskers" or needles is heated at temperature ranging from about 900° C. to about 1200° C. to produce silicon nitride which retains the whisker or needle morphological characteristics of the silicon disulfide. Silicon carbide, e.g. in the form of whiskers, also can be prepared by reacting substituted ammonia, e.g. methylamine, or a hydrocarbon containing active hydrogen-containing groups, such as ethylene, with silicon disulfide, at elevated temperature, e.g. 900° C.

10 Claims, 6 Drawing Figures

10 μ

1 μ

100μ

1μ

1μ

PROCESS FOR PRODUCING AMORPHOUS AND CRYSTALLINE SILICON NITRIDE

The Government has rights in this invention pursuant to Contract No. DE-AC03-78ERO1885 awarded by the U.S. Department of Energy.

BACKGROUND OF THE INVENTION

The present invention relates to the production of amorphous silicon nitride or silicon carbide, and is particularly concerned with a process for producing such products, particularly amorphous or crystalline silicon nitride, having a desired morphology, for example in the form of needles.

Silicon nitride is a highly desirable refractory material having wide industrial use such as the manufacture of crucibles, cutting tools and also as a filler for plastic, rubber and silicon compounds and for mold lubrication, insulation and coatings, and including uses in adiabatic diesels, high temperature turbine blades, and the like.

For large commercial application, it is desirable to provide silicon nitride in finely divided, pure, state. Commercially available silicon nitride has relatively large undesirable particle size and when it is attempted to reduce its particle size as by comminution, the resulting product often contains undesirable impurities.

Conventionally, silicon nitride has been prepared by the nitridation of elemental silicon. However, such process often leads to production of undesirably coarse product. Further, since fine silicon powder tends to adsorb atmospheric impurities, the resulting product often is highly contaminated. Moreover, the production of fine, active silicon nitride by silicon nitridation is difficult since high purity silicon forms protective nitride layers.

It has also been proposed to prepare silicon nitride in a highly pure, controlled particle form by the reaction of silicon tetrachloride with liquid ammonia, but retention of chlorine in the product amorphous silicon nitride was a problem, which required long-term extraction with liquid ammonia to completely remove the chlorine.

U.S. Pat. No. 3,211,527 to Forsyth discloses production of fine silicon nitride by reaction of silicon monosulfide vapor and ammonia at temperatures ranging from about 1250° C. to 1500° C. in a reactor, and cooling and collecting the silicon nitride removed from the reactor.

NATO Advanced Study Institutes, *Nitrogen Ceramics*, Nordhoff 1977, and *Progress in Nitrogen Ceramics*, Nijhoff 1983, both edited by F. L. Riley, disclose the prior art for production of silicon nitride.

Silicon carbide whisker products have been formed by high temperature reaction of sand and coke. In U.S. Pat. No. 3,709,981, silicon carbide in the form of whiskers or fibers is prepared by reacting at elevated temperature of the order of 1500° C., silica, elemental carbon, a source of sulfur and a source of hydrogen, such as hydrogen sulfide, and a gaseous source of carbon such as a hydrocarbon or other carbon containing compounds, e.g. carbon disulfide.

SUMMARY OF THE INVENTION

One object of the invention is to provide amorphous or crystalline silicon nitride of high purity and desirable morphology, preferably in the form of needles or whiskers.

Another object of the invention is the provision of a process for producing amorphous or crystalline silicon nitride by the reaction of gaseous ammonia with a sulfur derivative of silicon in a solid phase reaction.

The above objects are achieved according to the invention by reacting silicon disulfide with ammonia gas at elevated temperature sufficient to form amorphous silicon nitride. Further heating with or without ammonia or nitrogen will produce crystalline silicon nitride.

More particularly, the process comprises reacting silicon disulfide in solid form with ammonia gas by heating the reactants at temperature preferably ranging from about 800° C. to about 1450° C., most desirably about 900° C. to about 1200° C., and recovering amorphous silicon nitride from the reaction zone.

Preferably, the orthorhomic silicon disulfide is in the form of needles and upon heat treatment with ammonia gas in the temperature range noted above, a solid phase replacement reaction occurs, and the silicon disulfide is converted to amorphous silicon nitride which retains the orthorhombic needle morphological characteristics of the silicon disulfide.

The invention process provides an economical method for pseudomorphic conversion of silicon disulfide to amorphous silicon nitride.

DESCRIPTION OF DRAWINGS

The invention will be more readily understood by the detailed description of the invention below, taken in connection with the accompanying drawings wherein.

DETAILED DESCRIPTION OF PREFERRED EMBODIMENTS

A substantially pure form of silicon disulfide, $SiS_2$, should be used as reactant in the invention process. Commercially available silicon disulfide is often impure and susceptible to moisture contamination. For purposes of the present invention, silicon disulfide is produced by reacting silicon and hydrogen sulfide at elevated temperature ranging from about 800° C. to about 1,000° C. Silicon powder of suitable small particle size is employed, and a moisture and oxygen free environment is maintained in the reaction zone, utilizing a mixture of hydrogen sulfide and argon in a high-alumina reaction vessel. Temperature, gas flow rate, and silicon powder particle size, together with maintenance of a moisture and oxygen free environment in the reaction zone are of importance in producing high purity silicon disulfide.

Figure 1:
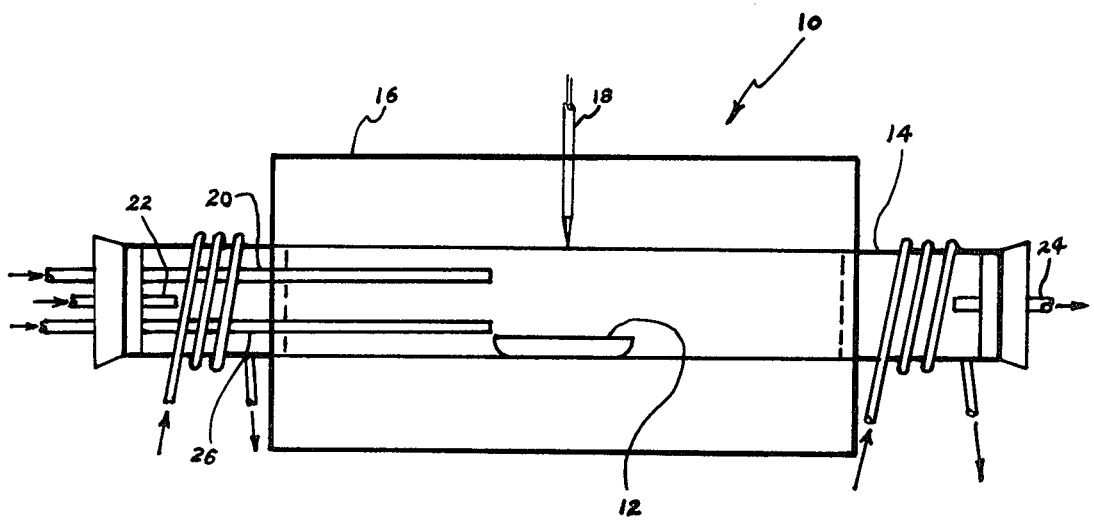
FIG. 1 illustrates an apparatus for carrying out the invention process.

FIG. 1 illustrates an apparatus which can be used for producing silicon disulfide. Silicon powder is placed in a boat 12 which is positioned within a high alumina tube 14 functioning as the reaction zone. The tube 14 is positioned within a furnace heating jacket 16 provided with a thermocouple 18 for monitoring the reaction temperature in the reaction tube 14.

When the temperature within the tube 14 is raised to a suitable level, e.g. about 900° C., hydrogen sulfide is passed through a tube 20 and argon is passed through an inlet tube 22, into the reaction zone above the boat 12, in a volumetric proportion, e.g. of 10% hydrogen sulfide and 90% argon. Gas dilution with argon prevents over-rapid reaction rates. Gas flow rate and reaction time are sufficient to permit total conversion of the silicon to silicon disulfide in the boat 12. Reaction product gases composed essentially of hydrogen are exhausted at the outlet 24.

In its preferred pure form, the silicon disulfide is a silky-white asbestos-like product yielding the normal orthorhombic crystalline X-ray diffraction pattern and exhibits a needle or whisker morphology.

A mixture of argon and ammonia, formed by introducing ammonia through tube 26 and argon through the inlet tube 22 is passed into the reaction zone above the silicon disulfide in the form of a bed of whiskers or needles in the boat. At temperatures between about 900° and 1200° C., a pseudomorphic solid phase reaction occurs between the ammonia and the silicon disulfide, converting the latter to amorphous silicon nitride, $Si_3N_4$.

The initial reaction of ammonia with the $SiS_2$ between about 800° C. and about 900° C. replaces a proportion of the Si-S bonds with Si-N units. At this point the developing amorphous Si-N solid can be progressively heated further to allow continuing substitution to occur, so that the reaction continues as a solid phase reaction until completion.

At lower temperatures of reaction, amorphous silicon nitride product having different external morphologies is produced. Thus, at temperatures below 900° C., e.g. 25° C. to a temperature approaching 900° C., e.g. 300° C., a "spaghetti" form of amorphous silicon nitride is produced. When ammonia passage is commenced with the silicon disulfide already at between 900° C. and 1200° C. a pseudormorphic conversion of silicon disulfide to amorphous silicon nitride occurs, forming needles or whiskers of silicon nitride having substantially the same external orthorhombic needle or whisker morphology as the silicon disulfide. The 900° to 1200° C. temperature range of reaction is preferred for obtaining the preferred needle or whisker form of silicon nitride product. The needle or whisker form of silicon nitride is of importance particularly in connection with its potential use for producing refractory composites. The amorphous form of $Si_3N_4$ can be converted to the crystalline form on further heating above about 1450° C.

The products of reaction of $SiS_2$ with $NH_3$ at lower temperatures, i.e. the spaghetti, vermiform or spherical types of $Si_3N_4$, also have their specialized uses, e.g. as an insulating material in the case of the spaghetti or vermiform types, or for sintering the spherical type to a bulk body. These types pseudomorphically convert to amorphous needle or crystalline forms of $Si_3N_4$ at higher temperatures.

The following are examples of practice of the invention, although it will be understood that these examples are to be considered as exemplary only.

EXAMPLE I

Finely powdered silicon was placed in an alumina boat in an apparatus of the type illustrated in FIG. 1, and heated to about 900° C. A mixture of argon and 10% hydrogen sulfide by volume was passed over the powdered silicon at 900° C. at a flow rate of about 30 ml/min. measured at 1 atm, pressure. A bed of long whiskers of silicon disulfide was produced, as shown by the photomicrograph in FIG. 2. The orthorhombic needle formation of the silicon disulfide whiskers is shown in the more highly magnified photomicrograph of FIG. 3, showing the formation of liquid drops which are sometimes formed at the ends of the whiskers, and which suggest growth by the Vapor-Liquid-Solid (VLS) mechanism.

While maintaining the temperature of the silicon disulfide product at 900° C., a mixture of argon and 10% ammonia by volume was passed over the silicon disulfide, and venting a reactant gas comprising chiefly ammonium sulfides. The rate of flow of ammonia gas over the silicon disulfide was about 30 ml/min. at atmospheric pressure.

Figure 4:
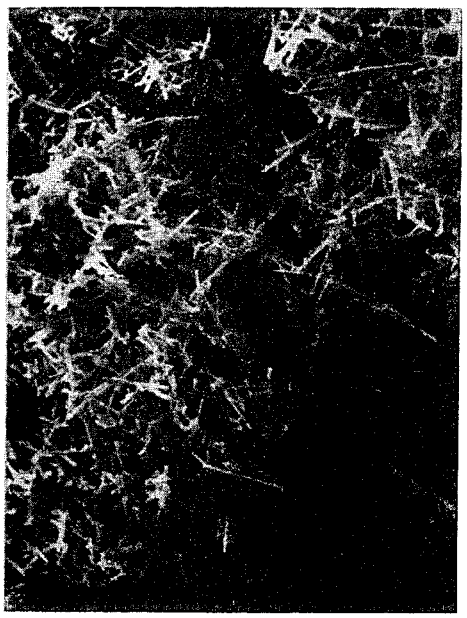
FIGS. 4 and 5 are photomicrographs of the reaction product, silicon nitride, also in the form of whiskers taken at different magnifications, produced at reaction temperatures of 900° C. and 1200° C., according to the invention process.
Figure 5:
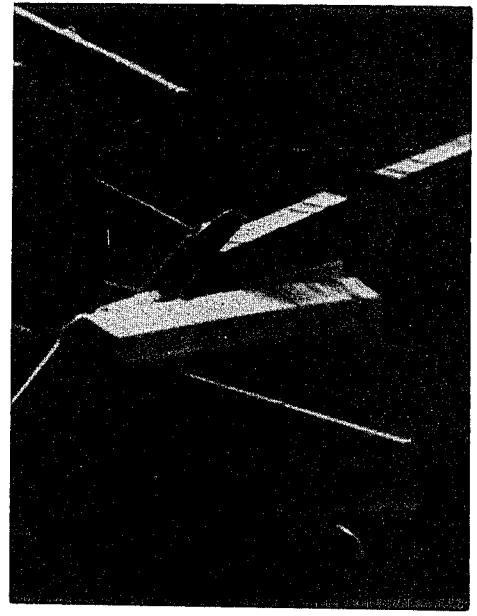

The silicon disulfide was converted by solid phase reaction to amorphous silicon nitride in the form of a whisker bed, as shown by the photomicrograph in FIG. 4, wherein the amorphous silicon nitride retained the sam external orthorhombic needle morphological characteristics of the silicon disulfide, as further shown by the photomicrograph in FIG. 5 taken at a higher magnification than FIG. 4. Infrared spectroscopic studies of the resulting product, ground with a KBr pellet revealed an absorption pattern identical to that assigned to amorphous silicon nitride.

EXAMPLE II

The process of Example I was repeated except that the silicon disulfide reactant was heated to 1200° C. followed by introduction of the mixture of argon and ammonia.

Figure 2:
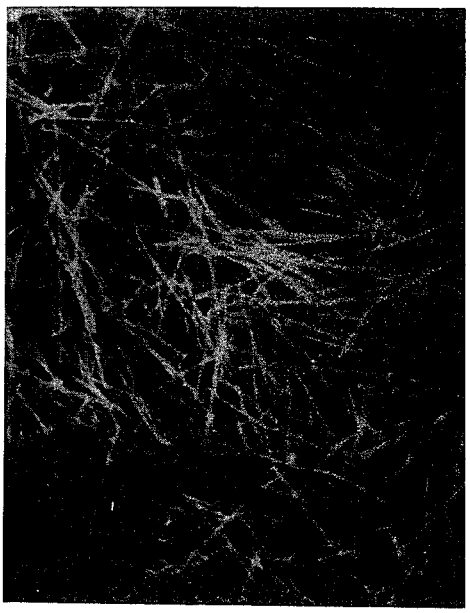
FIGS. 2 and 3 are photomicrographs of silicon disulfide in the form of "whiskers," taken at different magnifications, employed as reactant in the invention process.
Figure 3:
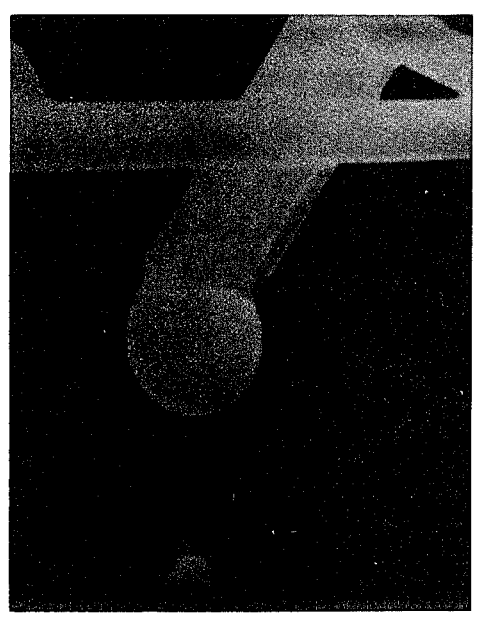

The resulting amorphous silicon nitride product also was observed to have an orthorhombic needle morphology as seen in FIGS. 4 and 5, similar to the needles or whiskers of the silicon disulfide reactant shown in FIGS. 2 and 3.

EXAMPLE III

The procedure of Example I was essentially repeated except that the silicon disulfide reactant was cooled to room temperature in argon and then an argon/10% ammonia mixture was passed over the silicon disulfide while showly heating it up to 1250° C. in one case and to higher than 1450° C. in another case.

Figure 6:
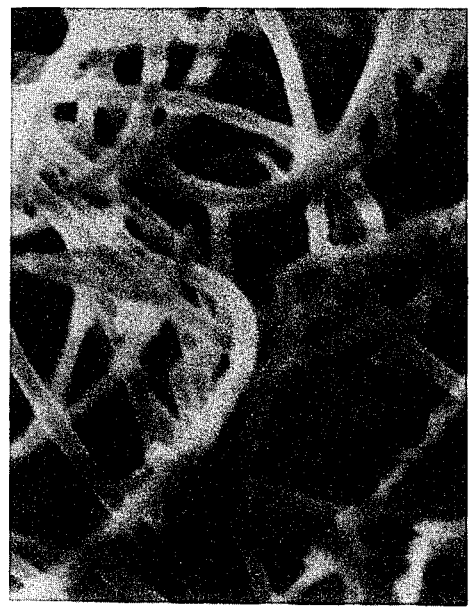
FIG. 6 is a photomicrograph of the silicon nitride reaction product having a "spaghetti" morphology produced at reaction temperatures commencing at room temperature and ramping up to above 1200° C.

The resulting amorphous silicon nitride product had an amorphous "spaghetti" morphology in the first case, as illustrated by the photomicrograph of FIG. 6. In the second case at temperature above about 1450° C. the amorphous $Si_3N_4$ converts to crystalline $\alpha$-$Si_3N_4$.

Silicon disulfide, for example in the form of whiskers, can also be reacted with derivatives of ammonia, including amines such as methylamine or hydrazine, imines, and hydrocarbons having active hydrogen-containing groups such as unsaturated, e.g. ethylenic groups, as exemplified by ethylene or acetylene. These reactions are also solid phase reactions carried out at high temperature, e.g. of the order of 900° C. to 1500° C. Where the reactant contains nitrogen and no carbon, as in the case of hydrazine, the resulting compound is also silicon nitride having a morphology, such as in the form of whiskers, corresponding to the silicon disulfide whiskers employed as starting material. However, where the substitute for ammonia contains carbon, as in the case of amines such as methylamine and imines, the resulting product is silicon carbide, which can also be in the form of whiskers, and which can be amorphous or crystalline, depending upon reaction temperature. Further, where the reactant with silicon disulfide is a hydrocarbon such as ethylene, acetylene, or compounds having activated double bond systems including C=CH—CH—C systems, the resulting product is silicon carbide having a morphology which can also be in the form of whiskers, and again retaining the "whisker" morphology of the silicon disulfide starting material.

The following example illustrates production of silicon carbide according to the invention process.

EXAMPLE IV

The procedure of Example I is substantially followed, except that a mixture of argon and 10% methylamine vapor is employed and the silicon disulfide whiskers heated to 900° C.

The resulting product is silicon carbide in whisker form.

From the foregoing, it is seen that the present invention provides a unique process for producing silicon nitride, e.g. in the form of needles, by a simple solid phase reaction of silicon disulfide, e.g. in the form of needles, at certain elevated temperatures. A similar type of solid phase reaction between silicon disulfide and carbon-containing organic compounds can also be carried out to produce the refractory, silicon carbide, e.g. in any desired form such as silicon carbide whiskers or fibers for structural purposes.

Since variations and modifications of the invention process without departing from the invention concept will occur to those skilled in the art, the invention described herein is not to be taken as limited except by the scope of the appended claims.

What is claimed is:

1. A process for producing silicon nitride which comprises reacting silicon disulfide in solid form with ammonia gas at temperature ranging from about 800° C. to about 1450° C. and recovering amorphous silicon nitride.

2. The process of claim 1, including further heating the reaction product to temperature greater than 1450° C., to form crystalline silicon nitride.

3. The process of claim 1, employing a mixture of ammonia gas and argon.

4. The process of claim 1, including first reacting silicon powder with hydrogen sulfide at elevated temperature to produce said silicon disulfide.

5. The process of claim 2, said reaction being carried out at temperature ranging from about 900° C. to about 1200° C.

6. The process of claim 5, the silicon disulfide being in the form of orthorhombic needles.

7. The process of claim 6, the reaction taking place in the solid phase and the amorphous silicon nitride retaining the orthorhombic needle morphological characteristics of the silicon disulfide.

8. A process for producing amorphous silicon nitride which comprises heating silicon disulfide in the form of whiskers with ammonia gas at temperature ranging from about 900° C. to about 1200° C., to produce amorphous silicon nitride whiskers, and recovering said amorphous silicon nitride.

9. The process of claim 8, employing a mixture of ammonia gas and argon.

10. The process of claim 9, including initially heating silicon powder to about 900° C. and passing a mixture of argon and hydrogen sulfide over said silicon powder to produce said silicon disulfide whiskers, and passing a mixture of ammonia gas and argon over said silicon disulfide whiskers, at said temperature of about 900° C. to about 1200° C.

* * * * *